(12) United States Patent
Tang et al.

(10) Patent No.: US 11,017,979 B2
(45) Date of Patent: May 25, 2021

(54) METHOD OF ION IMPLANTATION AND AN APPARATUS FOR THE SAME

(71) Applicant: Shanghai Huali Microelectronics Corporation, Shanghai (CN)

(72) Inventors: Yi Tang, Shanghai (CN); Weiyimin Dong, Shanghai (CN)

(73) Assignee: SHANGHAI HUALI MICROELECTRONICS CORPORATION, Shanghai (CN)

(*) Notice: Subject to any disclaimer, the term of this patent is extended or adjusted under 35 U.S.C. 154(b) by 0 days.

(21) Appl. No.: 16/566,876

(22) Filed: Sep. 11, 2019

(65) Prior Publication Data

US 2020/0152411 A1 May 14, 2020

(30) Foreign Application Priority Data

Nov. 13, 2018 (CN) .......................... 201811344422.5

(51) Int. Cl.
*H01J 37/147* (2006.01)
*H01J 37/317* (2006.01)
*H01L 21/265* (2006.01)

(52) U.S. Cl.
CPC ...... *H01J 37/1472* (2013.01); *H01J 37/3171* (2013.01); *H01L 21/26586* (2013.01); *H01J 2237/152* (2013.01)

(58) Field of Classification Search
CPC ..................................................... H01L 21/265
See application file for complete search history.

(56) References Cited

U.S. PATENT DOCUMENTS

| 2015/0136996 A1* | 5/2015 | Inada | H01J 37/304 |
| | | | 250/396 R |
| 2016/0013014 A1* | 1/2016 | Kagawa | H01J 37/241 |
| | | | 250/396 R |
| 2016/0042915 A1* | 2/2016 | Sano | H01J 37/3171 |
| | | | 250/492.3 |

* cited by examiner

*Primary Examiner* — Yu-Hsi D Sun
(74) *Attorney, Agent, or Firm* — Adsero IP

(57) ABSTRACT

The present disclosure relates to semiconductor devices, specifically discloses a method and an apparatus for ion implantation. The above method may comprise: generating a particle beam that satisfies the implantation energy, wherein the particle beam comprises the target ion and the impurity particle; applying a first deflection magnetic field to the particle beam to deflect the particle beam, and applying a second deflection magnetic field to the deflected particle beam to cause a second deflection of the particle beam to separate the target ion from the impurity particle; and implanting the separated target ion into the semiconductor wafer.

15 Claims, 5 Drawing Sheets

METHOD OF ION IMPLANTATION AND AN APPARATUS FOR THE SAME

CROSS-REFERENCES TO RELATED APPLICATIONS

The present application claims priority to Chinese Patent Application No. 201811344422.5, filed on Nov. 13, 2018, entitled "A METHOD OF ION IMPLANTATION AND AN APPARATUS FOR THE SAME", which is incorporated by reference herein for all purposes.

FIELD

The present disclosure relates to the field of semiconductor devices, and specifically discloses a method of ion implantation and an apparatus for ion implantation.

BACKGROUND OF THE INVENTION

With the rapid development of very large scale integrated (VLSI) circuit technology, the size of semiconductor devices is shrinking. In the manufacturing process of such a miniaturized semiconductor device, a multi-pass ion implantation process comprising ultra-shallow junction implantation, pocket structure implantation, Halo structure implantation, channel implantation, high-precision sidewall implantation and pixel region plasma is required as a key step in changing the electrical properties of the wafer. In order to further ensure the reliability of the semiconductor device, the chemical purity requirement for the ions implanted into the device is increasing.

FIG. 1 shows the process of implanting ions by a conventional ion implantation machine. Through the method of deflecting the ion beam by a certain deflection angle when the ion beam is passed through the angular energy filter (AEF), a portion of the impurity particles can be thereby filtered out from the beam line.

For example, when implanting ions with the conventional SEN implanter, an AEF process to deflect the beam line by 20°, can be provided before the ion implantation conducted by the SHX-III/S high current SEN (HCS) implanter; while an AEF process to deflect the beam line by 15°, can be provided before the ion implantation conducted by the MC3-II/GP medium current SEN (HCS) implanter.

As shown in FIG. 1, although the existing ion implantation method can filter out some of the impurity ions, there are still some other impurity ions that cannot be filtered out, and the remained impurity ions will be implanted into the wafer together with the target ions. Therefore, the conventional ion implantation method still somewhat causes energy pollution, and cannot meet the increasingly higher purity requirements of the implanted ions, thereby affecting the product quality of the semiconductor device.

In sum, there is a need in the field for a technology that can further increase the purity of ions implanted into a semiconductor device, thereby improving the product quality of the semiconductor device.

BRIEF SUMMARY OF THE INVENTION

A brief overview of one or more aspects is provided below to provide a basic understanding of these aspects. The summary is not an extensive overview of all of the aspects that are contemplated, and is not intended to identify key or decisive elements in all aspects. The sole purpose of the summary is to present some concepts of one or more aspects in a simplified form as a prelude to the more detailed description that is presented later.

In order to further improve the purity of ions implanted into the semiconductor device to avoid energy contamination, thereby improving the product quality of the semiconductor device, the present disclosure provides a method of ion implantation, and an apparatus for ion implantation.

The method of ion implantation provided by the present disclosure may comprise the steps of:

generating a particle beam that satisfies the implanted energy, and the particle beam contains the target ions and the impurity particles;

applying a first deflection magnetic field to the particle beam to deflect the particle beam, and applying a second deflection magnetic field to the deflected particle beam to cause a second deflection of the particle beam to separate the target ions from the impurity particles; and implanting the separated target ions into the semiconductor wafer.

As the method of ion implantation described above, the first deflection magnetic field may deflect the target ions by a first angle, and the second deflection magnetic field may deflect the target ions by a second angle, and the first angle may be different from the second angle.

As the method of ion implantation described above, the second angle may be greater than the first angle to enhance the separation of the target ions and the impurity particles in the second deflection.

As the method of ion implantation described above, the first deflection magnetic field may deflect the target ions by the first angle in a first direction, and the second deflection magnetic field may deflect the target ions by the second angle in a second direction, which is different from the first direction.

As the method of ion implantation described above, the first deflection magnetic field may deflect the target ions by the first angle in a predetermined direction, and the second deflection magnetic field may deflect the target ions by the second angle in the predetermined direction.

As the method of ion implantation described above, the sum of the first angle and the second angle may be proportional to the implanted energy.

As the method of ion implantation described above, the sum of the first angle and the second angle may be in the range of 15°-20°; and/or the second angle may be 1.5-2 times the first angle.

The present disclosure further provides an apparatus for ion implantation. The apparatus for ion implantation comprises a particle generation device, a first angular energy filter (AEF) device, a second angular energy filter device, and an ion implantation device.

The particle generating device generates a particle beam that satisfies the implanted energy, and the particle beam comprises the target ions and the impurity particles.

The first angular energy filter device applies a first deflection magnetic field to the particle beam to deflect the particle beam, and the second angular energy filter device applies a second deflection magnetic field to the deflected particle beam to cause a second deflection of the particle beam to separate the target ions from the impurity particles.

The ion implantation device implants the separated target ions into the semiconductor wafer.

According to the apparatus for ion implantation described above, the first deflection magnetic field may deflect the target ions by a first angle, and the second deflection magnetic field may deflect the target ions by a second angle, and the first angle may be different from the second angle.

According to the apparatus for ion implantation described above, the second angle may be greater than the first angle to enhance the separation of the target ions and the impurity particles in the second deflection.

According to the apparatus for ion implantation described above, the first deflection magnetic field may deflect the target ions by the first angle in a first direction, and the second deflection magnetic field may deflect the target ions by the second angle in a second direction, which is different from the first direction.

According to the apparatus for ion implantation described above, the first deflection magnetic field may deflect the target ions by the first angle in a predetermined direction, and the second deflection magnetic field may deflect the target ions by the second angle in the predetermined direction.

According to the apparatus for ion implantation described above, the sum of the first angle and the second angle may be proportional to the implanted energy.

According to the apparatus for ion implantation described above, the sum of the first angle and the second angle may be in the range of 15°-20°; and/or the second angle may be 1.5-2 times the first angle.

According to the apparatus for ion implantation described above, the inlet of the first angular energy filter device may be larger than the outlet of the first angular energy filter device to remove a portion of the impurity particles; the inlet of the second angular energy filter device may be larger than the outlet of the second angular energy filter device to remove a portion of the impurity particles; and the inlet of the second angular energy filter device may be smaller than the outlet of the first angular energy filter device.

Based on the above description, the advantages of the present disclosure may include that the purity of ions implanted into the semiconductor device can be further improved to avoid energy contamination, thereby improving the product quality of the semiconductor device.

REFERENCE SIGNS

Figure 1:
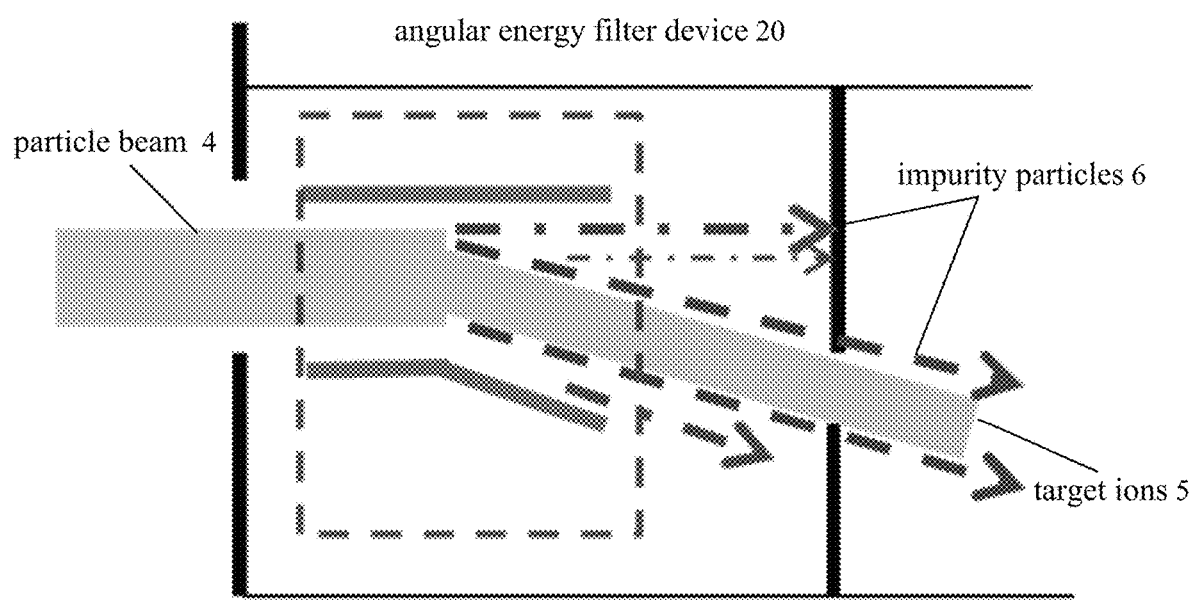
FIG. 1 shows the principle of ion implantation by a conventional ion implantation machine.

1 particle generating device
20 angular energy filter device
21 first angular energy filter device
22 second angular energy filter device
3 ion implantation device
4 particle beam
5 target ions
6 impurity particles
X1 horizontal distance before and after the deflection of particle beam
R1 deflection radius
501-503 steps of the method of ion implantation

DETAILED DESCRIPTION OF THE INVENTION

The embodiments of the present disclosure are described in the following detailed description. Although the description of the present disclosure will be described in conjunction with the preferred embodiments, this is not a limitation of the present disclosure. On the contrary, the disclosure is described in connection with the embodiments so as to cover other alternatives or modifications that are possible in the embodiments of the present disclosure. In order to provide a thorough understanding of the present disclosure, many specific details are included in the following description. The present disclosure may also be practiced without these details. In addition, some specific details are omitted in the description in order to avoid confusing or obscuring the present disclosure.

In the description of the present disclosure, it should be noted that the terms "installation", "connecting", and "connected" should be understood broadly unless explicitly stated and defined otherwise. For example, the terms "installation", "connecting", and "connected" may be either a fixed connection, a detachable connection, or an integral connection; the terms may be either a mechanical connection or an electrical connection; the terms also may be either a direct connection, an indirect connection through an intermediate medium, or an internal connection between two components.

In addition, "up", "down", "left", "right", "top", "bottom", "horizontal", "vertical" used in the following description shall be understood as the orientation described in the paragraph and shown in the related figure. The relative term is used for convenience of description only, and does not mean that the device described therein is to be manufactured or operated in the specific orientation, and therefore should not be construed as limiting the present disclosure.

Understandably, although the terms "first", "second", "third", etc. may be used to describe various components, regions, layers and/or portions to distinguish different components, regions, layers and/or portions, the order of these components, regions, layers and/or portions described above should not be limited by the terms. Therefore, a first component, region, layer and/or portion mentioned below may be also mentioned as a second component, region, layer and/or portion without departing from some embodiments of the present disclosure.

Although the method is illustrated and described as a series of actions for the purpose of simplifying the explanation, it should be understood and appreciated that these methods are not limited by the order of the actions. In some embodiments, some actions may occur in different orders and/or concurrently with other actions that are illustrated and described herein or that are not illustrated and described herein, in accordance with one or more of the embodiments.

In order to further increase the purity of ions implanted into a semiconductor device to avoid energy contamination, thereby improving the product quality of the semiconductor device, the present disclosure provides an embodiment of a method of ion implantation, and an embodiment of an apparatus for ion implantation.

Figure 2:
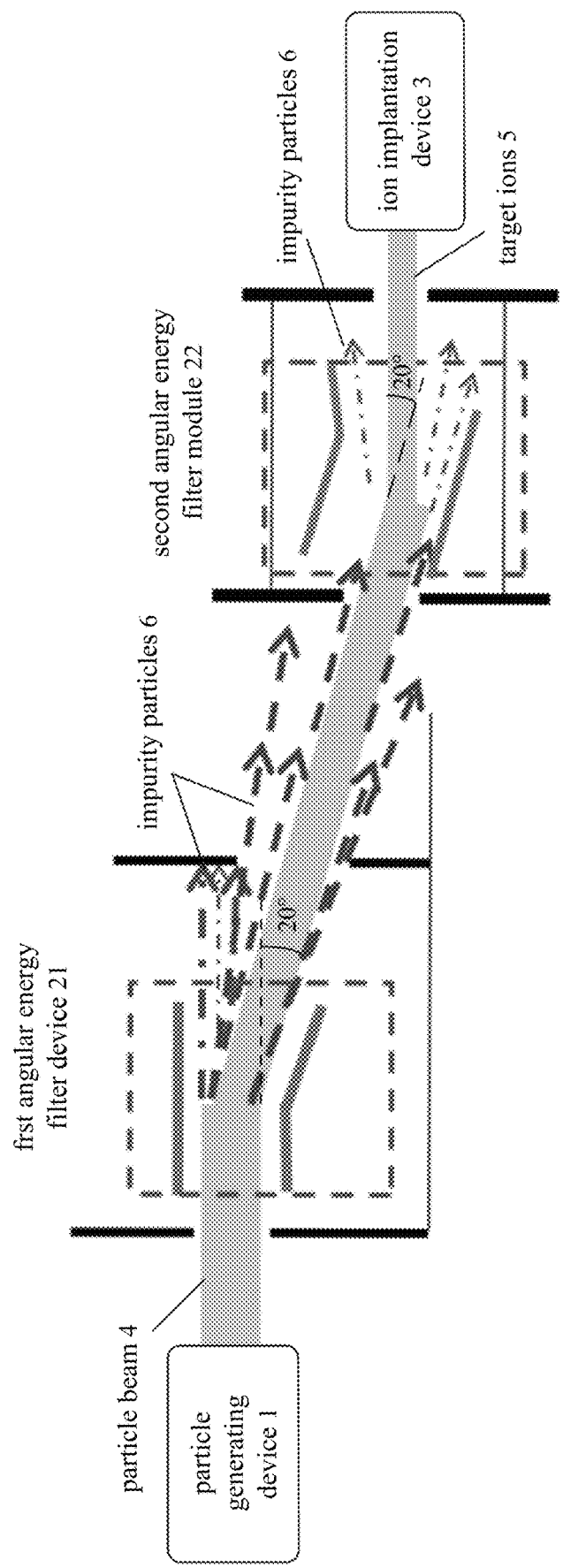
FIG. 2 shows the principle of ion implantation according to an embodiment of the present disclosure.

As shown in FIG. 2, the apparatus for ion implantation described in this embodiment may comprise:

a particle generation device 1, a first angular energy filter (AEF) device 21, a second angular energy filter device 22, and an ion implantation device 3, wherein the particle generating device 1 may generate a particle beam 4 that satisfies the implanted energy, wherein the particle beam 4 comprises the target ions 5 and the impurity particles 6;

the first angular energy filter device 21 may apply a first deflection magnetic field to the particle beam 4 to deflect the particle beam 4, and the second angular energy filter device 22 may apply a second deflection magnetic field to the deflected particle beam to conduct a second deflection of the particle beam to separate the target ions 5 from the impurity particles 6; and the ion implantation device 3 may implant the separated target ions 5 into the semiconductor wafer.

Regarding the apparatus for ion implantation described above, the particle generation device 1 includes, but is not limited to, a plasma type particle generation device, and an electron collision type particle generation device.

The velocity at which the target ions 5 and the impurity particles 6 in the particle beam 4 are moved directionally depends on the implanted energy. The higher the implanted energy, the faster the target ions 5 and the impurity particles 6 are directionally moved. The target ions 5 may be anions or cations. The target ions 5 may be metal ions or non-metal ions. The target ions 5 may be monovalent ions or multivalent ions. The impurity particles 6 may be uncharged impurity particles or may be other charged impurity ions 6 than the target ions 5.

The first angular energy filter device 21 and the second angular energy filter device 22 include, but are not limited to, energy screening devices capable of generating a deflection magnetic field.

When the target ions 5 and the impurity particles 6 in the particle beam 4 pass through the first angular energy filter device 21 and the second angular energy filter device 22 in an incident direction, the deflection magnetic field generates a Lorentz force on the target ions 5 and the charged impurity ions 6 respectively, causing them to deflect.

In some embodiments, in order to filter the impurity particles 6 better, a stronger deflection magnetic field may be applied to the particle beam 4 that has larger implanted energy to deflect the target ions 5 by a larger angle, thereby obtaining higher ion purity.

Regarding the apparatus for ion implantation described above, FIG. 2 shows that when the particle beam 4 passes through the first angular energy filter device 21, the first deflection magnetic field generated by the first angular energy filter device 21 can cause the target ions 5 in the particle beam 4 to be deflected downward by 20° from the original horizontal direction.

According to the interval from the inlet to the outlet in the first angular energy filter device 21, and the deflection angle of 20°, the deflection distance of the target ions 5 in the vertical direction can be calculated. The first deflected particle beam can be thereby obtained by setting the outlet of the first angular energy filter device 21 at an appropriate height.

Since the uncharged impurity particles 6 in the beam line of the particle beam 4 are not affected by the first deflection magnetic field, the direction of its movement does not change. Therefore, the uncharged impurity particles 6 cannot pass through the outlet of the first angular energy filter device 21, thereby being filtered by the first angular energy filter device 21. The impurity particles 6 which are not charged in the beam line are greatly reduced.

To further increase the purity of the ions implanted into the semiconductor device, the first deflected particle beam can be further passed through the second angular energy filter device 22. The second deflection magnetic field generated by the second angular energy filter device 22 can cause a second deflection of the target ions 5 in the particle beam. A second deflected particle beam can be obtained by setting the outlet of the second angular energy filter device 22 at an appropriate height, thereby further filtering the unfiltered impurity particles in the first deflection, and further improving the purity of ions implanted into the semiconductor device.

The first deflection and the second deflection may be in different directions, the impurity ions 6 having a close charge-to-mass ratio to the target ions 5 are thereby better filtered. The different directions may include different horizontal directions, and may also include different vertical directions in the same horizontal direction. The vertical directions can be represented by different deflection angles in the same horizontal direction.

As shown in FIG. 2, the second deflection may be a deflection upward by 20° from the original horizontal direction, so that the exit direction of the particle beam after the two deflections is consistent with the incident direction. The process and alignment of the apparatus for ion implantation is thereby facilitated.

Embodiment of setting the first deflection downward by 20° and setting the second deflection upward by 20° to maintain the horizontal direction are described. In other embodiments, the first deflection and the second deflection may also be set by any deflection angle in any horizontal direction.

Regarding the apparatus for ion implantation described in the embodiment, the ion implantation device 3 may be disposed at the outlet of the second angular energy filter device 22, corresponding to the exit direction of the particle beam. Thereby, the target ions 5 obtained by the two deflection filtrations of the first angular energy filter device 21 and the second angular energy filter device 22 can be implanted into the semiconductor wafer accurately.

As described above, in the conventional production process, multivalent ion implantation is used in order to achieve the set high energy requirements. In order to further filter the impurity ions 6 having a similar charge-to-mass ratio with the target ions 5 to avoid the low-valent energy pollution during the multivalent ion implantation process, an embodiment of the apparatus for high-current ion implantation is also provided herein.

Regarding the apparatus for ion implantation described in the embodiment, the target ions 5 and the impurity particles 6 in the particle beam 4 pass through the first angular energy filter device 21 and the second angular energy filter device 22 in an incident direction. The first angular energy filter device 21 may generate a first deflection magnetic field that deflects the target ions 5 in the particle beam 4 downward by 20°. The second angular energy filter device 22 may generate a second deflection magnetic field that deflects the target ions 5 in the particle beam 4 upward by 25°.

The first deflection magnetic field and the second deflection magnetic field may be provided by an electric field in the form of an acceleration voltage V. The target ions 5 and the charged impurity ions 6 in the particle beam 4 are accelerated by the acceleration voltage V to obtain the deflection energy $E=qeV$, wherein q is the number of charges of the target ions 5 and the charged impurity ions 6, and e is the charge of a unit charge.

In some embodiments, the larger the acceleration voltage V, the greater the deflection energy obtained by the target ions 5 and the charged impurity ions 6 is. The deflection angle of the target ions 5 and the charged impurity ions 6 in the deflection magnetic field is thereby larger.

Therefore, the embodiment can achieve a further effect of filtering the impurity ions 6 which have a close charge-to-mass ratio to the target ions 5 by deflecting the particle beam 4 by different angles.

Figure 3A:
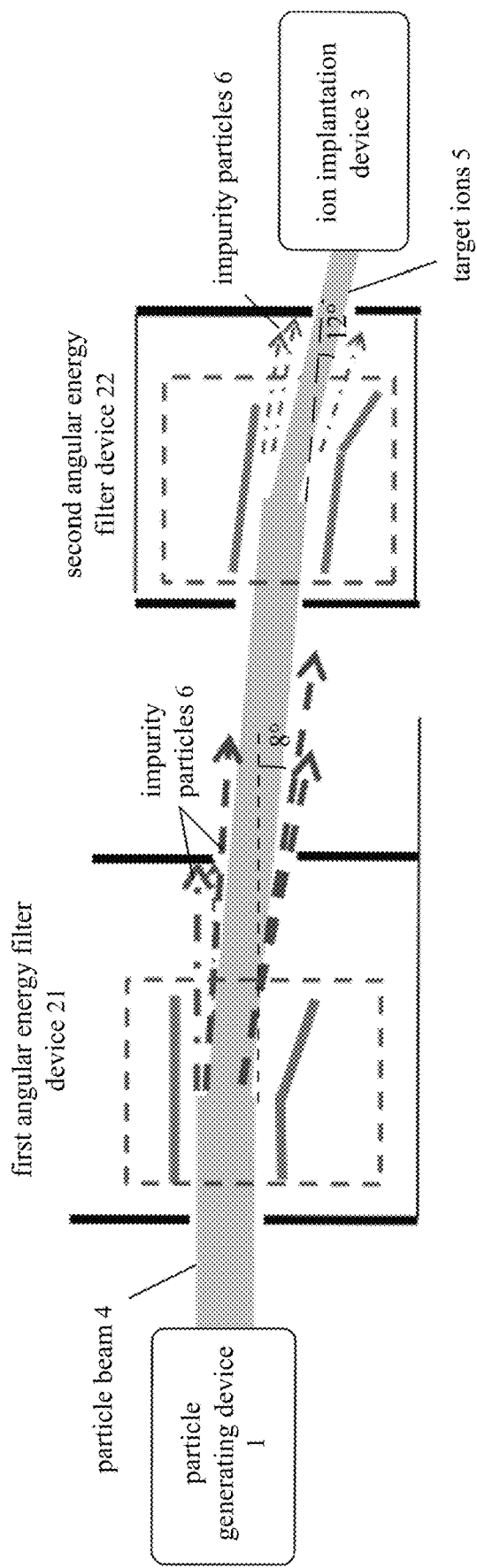
FIG. 3A shows the principle of ion implantation according to an embodiment of the present disclosure.

As shown in FIG. 3A, an embodiment of the apparatus for high-current ion implantation is also provided herein.

As the apparatus for ion implantation described in the embodiment, the target ions 5 and the impurity particles 6 in the particle beam 4 pass through the first angular energy filter device 21 and the second angular energy filter device 22 in an incident direction. The first angular energy filter device 21 may generate a first deflection magnetic field that deflects the target ions 5 in the particle beam 4 downward by a first angle. The second angular energy filter device 22 may generate a second deflection magnetic field that deflects the target ions 5 in the particle beam 4 downward by a second angle.

The sum of the first angle and the second angle may be 20°, thereby achieving the effect of filtering the impurity particles 6 in the high-current ion implantation apparatus. The specific range of the sum of the angles depends on the specific implanted energy of the particle beam 4. The larger the implanted energy of the particle beam 4, the larger the sum of the angles is.

With respect to the apparatus for ion implantation described in the embodiment, the first angle may be 8°. Based on the interval from the inlet to the outlet in the first angular energy filter device 21, and the first angle of 20°, the deflection distance of the particle beam 4 in the vertical direction can be calculated. The first deflected particle beam can be thereby obtained by setting the outlet of the first angular energy filter device 21 at an appropriate height. The outlet of the first angular energy filter device 21 may be smaller than the inlet of the first angular energy filter device 21 to remove the impurity particles 6 better.

Understandably, the small angle deflection method exemplified by the first angle can effectively filter out the uncharged impurity particles 6 and the charged impurity ions 6 which obtain high deflection energy from the first deflection magnetic field. However, in the actual production process of multivalent ion implantation, the method of small angle deflection, as well as the conventional single-stage deflection filtering method, cannot efficiently avoid the energy pollution of low-valent ions.

To further filter the impurity ions 6 with low deflection energy, the particle beam that has undergone the first deflection can be further passed through the second angular energy filter device 22. The second angular energy filter device 22 can cause the second deflection of the target ions 5 in the particle beam. The second angle of the second deflection may be 1.5-2 times the first angle. For example, the second angular energy filter device 22 may further deflect the deflected target ions 5 in the particle beam downward by 12° from its original horizontal direction in this embodiment, thereby satisfying the requirement that the target ions 5 need to be deflected by 20° in the high-current SEN (HCS) implanter.

The particle beam undergone the second deflection can be obtained by setting the outlet of the second angular energy filter device 22 at an appropriate height, thereby further filtering the impurity ions 6 having a charge-to-mass ratio close to the target ions 5, and further improving the purity of ions implanted into the semiconductor device.

The inlet of the second angular energy filter device 22 may be smaller than the outlet of the first angular energy filter device 21, thereby blocking particulate contamination in the particle beam 4. The outlet of the second angular energy filter device 22 may also be smaller than the inlet of the second angular energy filter device 22 to further remove the impurity particles 6.

Understandably, the method of large angle deflection, exemplified by the second angle, can effectively filter out the charged impurity ions 6 that obtain low deflection energy from the second deflection magnetic field.

In some embodiments, the sum of the first angle and the second angle is 20°, which is only a specific case to meet the demand of high-current SEN implanter (HCS). In other embodiments, the sum of the first angle and the second angle may be set within the range of 15°-20° responsive to the specific implanted energy of the particle beam 4, and the specific model and parameters of the ion implanter. Additionally, any angle within other suitable ranges may be also acceptable to obtain high purity target ions 5.

Setting the first deflection downward by 8° and setting the second deflection downward by 12° is only an embodiment being adaptive to the conventional high-current SEN (HCS) implanter with a downward deflection of 20°, thereby avoiding the need for adaptive modification of other configuration structures of the machine after adding the second angular energy filter device 22. In other embodiments, the first deflection and the second deflection may also be set by any other deflection angle in any horizontal direction. The horizontal directions of the first deflection and the second deflection may also be different.

In some embodiments, the magnitude of the deflection magnetic field can be characterized by the magnetic flux B of the magnetic field.

The deflection radius R of the target ions 5 and the charged impurity ions 6 in the particle beam 4 in the deflection magnetic field conforms to the formula:

$$R = \frac{1}{B}\sqrt{\frac{mV}{q}} = \frac{X}{\sin\theta}.$$

In the formula, R is the deflection radius; B is the magnetic flux; V is the acceleration voltage of the electric field; X is the horizontal distance before and after the deflection of the particle beam 4; θ is the deflection angle.

It can be seen from the formula that the larger the deflection angle θ, the smaller the horizontal distance X before and after the deflection of the particle beam 4 is, so that the magnetic flux B is larger, which means that the power consumption of the apparatus for ion implantation is larger.

When the target ions 5 in the particle beam 4 are deflected by 8° in the first deflection, the corresponding deflection radius of the target ions 5 is $$R2 = \frac{1}{B2}\sqrt{\frac{mV}{q}} = \frac{X2}{\sin 8°},$$

and the corresponding magnetic flux $$B2 = \frac{\sin 8°}{X2}\sqrt{\frac{mV}{q}}.$$

When the target ions 5 in the particle beam 4 are deflected by 12° in the second deflection, the corresponding deflection radius of the target ions 5 is $$R3 = \frac{1}{B3}\sqrt{\frac{mV}{q}} = \frac{X3}{\sin 12°},$$

and the corresponding magnetic flux is $$B3 = \frac{\sin 12°}{X3}\sqrt{\frac{mV}{q}}.$$

Figure 4:
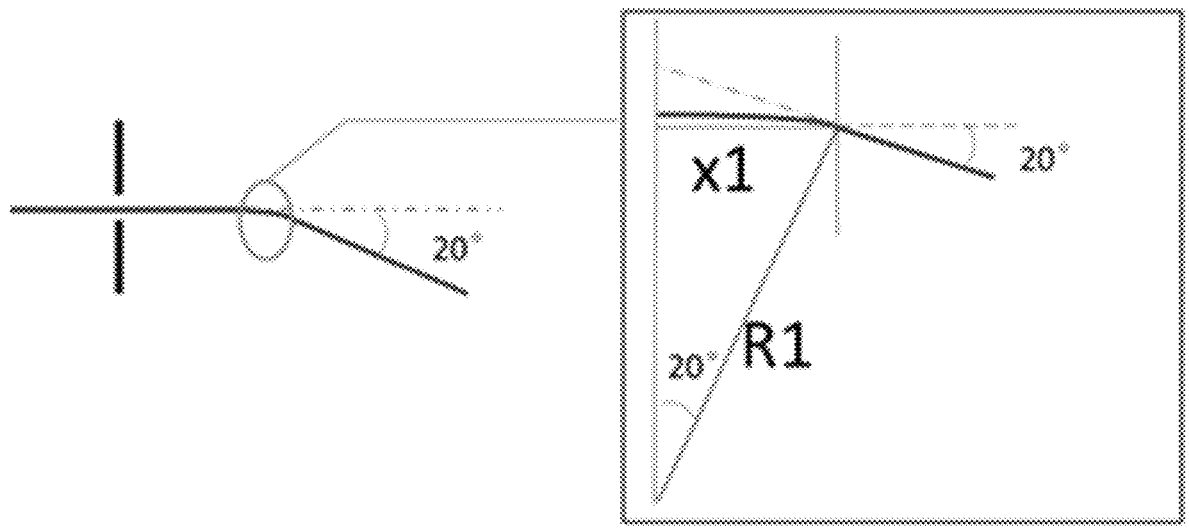
FIG. 4 shows the deflection radius R according to an embodiment of the present disclosure.

As shown in FIG. 4, when the first angle of the first deflection is 20°, the corresponding deflection radius of the target ions 5 in the particle beam 4 is $$R1 = \frac{1}{B1}\sqrt{\frac{mV}{q}} = \frac{X1}{\sin 20°},$$

and the corresponding magnetic flux is $$B1 = \frac{\sin 20°}{X1}\sqrt{\frac{mV}{q}}.$$

In order to ensure that the second deflection can efficiently filter the impurity ions 6 with low deflection energy in the particle beam 4, the second angle of the second deflection should thereby be greater than 20°. Accordingly, the corresponding deflection radius of the target ions 5 in the particle beam 4 is $$R4 = \frac{1}{B4}\sqrt{\frac{mV}{q}} = \frac{X4}{\sin \beta},$$

and the corresponding magnetic flux is $$B4 = \frac{\sin \beta}{X4}\sqrt{\frac{mV}{q}},$$

wherein sin β>sin 20° and X4<X2.

Therefore, it can be seen that B1+B4>B2+B3. The apparatus for ion implantation with a larger deflection angle causes larger power consumption.

According to the apparatus for ion implantation described in the embodiment, by dividing the total deflection angle of 20° into the first angle of 8° and the second angle of 12°, the power consumption of the apparatus for ion implantation can be reduced as much as possible while maintaining the total deflection angle unchanged.

Figure 3B:
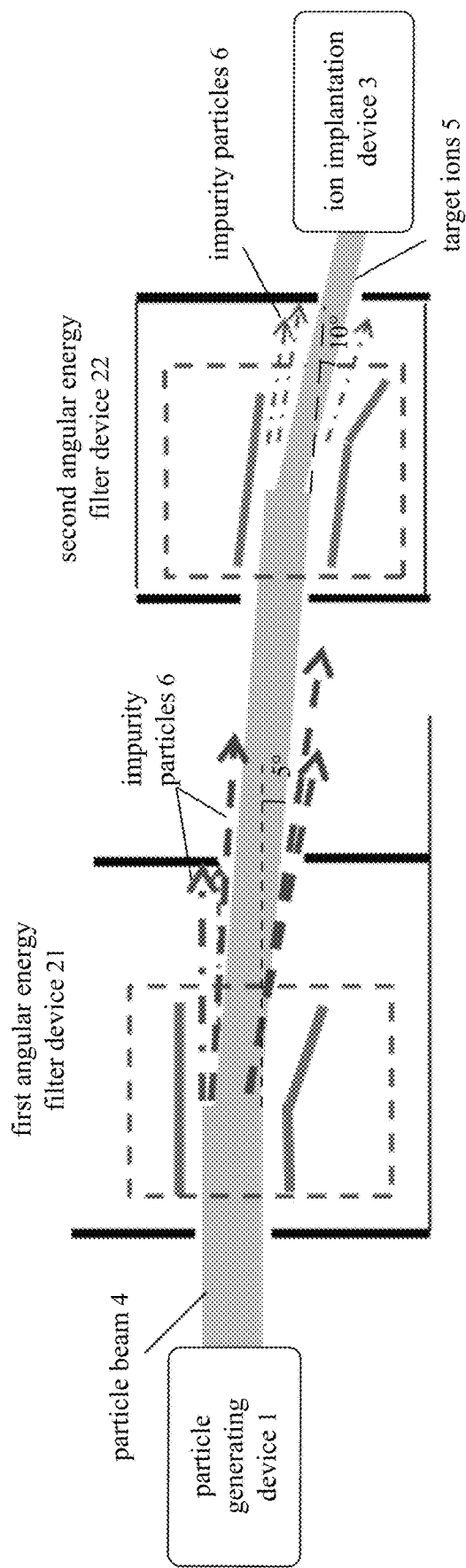
FIG. 3B shows the principle of ion implantation according to an embodiment of the present disclosure.

As shown in FIG. 3B, in one embodiment of the present disclosure also provides a medium-current SEN (MCS) implanter.

Regarding the apparatus for ion implantation described in the embodiment, the target ions 5 and the impurity particles 6 in the particle beam 4 pass through the first angular energy filter device 21 and the second angular energy filter device 22 in an incident direction. The first angular energy filter device 21 can generate a first deflection magnetic field that deflects the target ions 5 in the particle beam 4 downward by a first angle. The second angular energy filter device 22 can generate a second deflection magnetic field that deflects the target ions 5 in the particle beam 4 downward by a second angle.

The sum of the first angle and the second angle may be 15°, thereby effectively filtering the impurity particles 6 in the medium-current SEN (MCS) implanter. The specific range of the sum of the angles depends on the specific implanted energy of the particle beam 4. The larger the implanted energy of the particle beam 4, the larger the sum of the angles is.

Regarding the apparatus for ion implantation described in the embodiment, the first angle may be 5°. Based on the interval from the inlet to the outlet in the first angular energy filter device 21, and the first angle, the deflection distance of the target ions 5 in the vertical direction can be calculated. The first deflected particle beam can be thereby obtained by setting the outlet of the first angular energy filter device 21 at an appropriate height. The outlet of the first angular energy filter device 21 may be smaller than the inlet of the first angular energy filter device 21 to remove the impurity particles 6 better.

To further filter the impurity ions 6 with low deflection energy, the particle beam that has undergone the first deflection can be further passed through the second angular energy filter device 22. The second deflection magnetic field generated by the second angular energy filter device 22 can cause a second deflection of the target ions 5 in the particle beam. The second angle of the second deflection may be 1.5-2 times the first angle. For example, in the present embodiment, the second angular energy filter device 22 further deflects the target ions 5 in the particle beam downward by 10° from the original horizontal direction, thereby satisfying the requirement that the target ions 5 need to be deflected by 15° in the medium-current SEN (MCS) implanter.

The second deflected particle beam can be obtained by setting the outlet of the second angular energy filter device 22 at an appropriate height, thereby further filtering the impurity ions 6 having a charge-to-mass ratio close to the target ions 5, and further improving the purity of ions implanted into the semiconductor device.

The inlet of the second angular energy filter device 22 may be smaller than the outlet of the first angular energy filter device 21 to block particulate contamination in the particle beam 4. The outlet of the second angular energy filter device 22 may also be smaller than the inlet of the second angular energy filter device 22 to further remove the impurity particles 6.

Understandably, the method of large angle deflection, exemplified by the second angle, can effectively filter out the charged impurity ions 6 that obtain low deflection energy from the second deflection magnetic field.

In some embodiments, the sum of the first angle and the second angle is 15°, which is only a specific case to meet the demand of the medium-current SEN (MCS) implanter. In other embodiments, the sum of the first angle and the second angle may be set within the range of 15°-20° responsive to the specific implanted energy of the particle beam 4, and the specific model and parameters of the ion implanter. Additionally, any angle within other suitable ranges may be also acceptable to obtain high purity target ions 5.

Setting the first deflection downward by 5° and setting the second deflection downward by 10° is only an embodiment being adaptive to the conventional medium-current SEN (MCS) implanter with a downward deflection of 15°, thereby avoiding the need for adaptive modification of other configuration structures of the machine after adding the second angular energy filter device 22. In other embodiments, the first deflection and the second deflection may also be set by any other deflection angle in any horizontal direction. The horizontal directions of the first deflection and the second deflection may also be different.

According to another aspect of the disclosure, an embodiment of the method of ion implantation is further provided herein.

Figure 5:
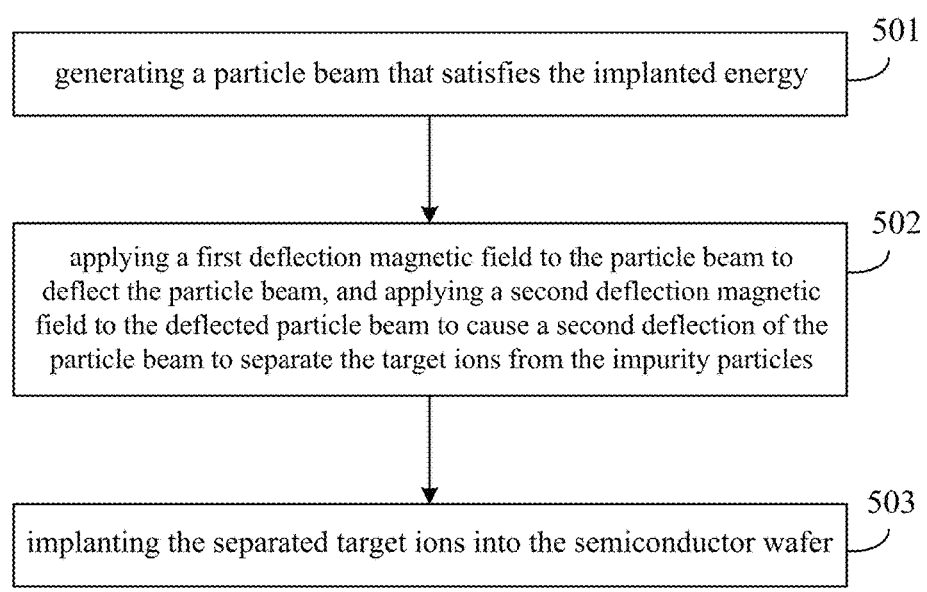
FIG. 5 shows the steps of the method of ion implantation according to an embodiment of the present disclosure.

As shown in FIG. 5, the method of ion implantation provided by the present disclosure may comprise the steps of:

501: generating a particle beam 4 that satisfies the implanted energy, wherein the particle beam 4 comprises the target ions 5 and the impurity particles 6;

502: applying a first deflection magnetic field to the particle beam 4 to deflect the particle beam 4, and applying a second deflection magnetic field to the deflected particle beam to cause a second deflection of the particle beam to separate the target ions 5 from the impurity particles 6;

503: implanting the separated target ions 5 into the semiconductor wafer.

As the method of ion implantation described in the embodiment, the velocity at which the target ions 5 and the impurity particles 6 in the particle beam 4 are moved directionally depends on the implanted energy. The higher the implanted energy, the faster the target ions 5 and the impurity particles 6 are directionally moved. The target ions 5 may be anions or cations.

The target ions 5 may be metal ions or non-metal ions. The target ions 5 may be monovalent ions or multivalent ions. The impurity particles 6 may be uncharged impurity particles or may be other charged impurity ions 6 than the target ions 5.

When the target ions 5 and the impurity particles 6 in the particle beam 4 pass through the first deflection magnetic field and the second deflection magnetic field in an incident direction, the deflection magnetic field generates a Lorentz force on the target ions 5 and the charged impurity ions 6 respectively, causing them to deflect.

In some embodiments, in order to filter the impurity particles 6 better, a stronger deflection magnetic field may be applied to the particle beam 4 that has a larger implanted energy to deflect the target ions 5 by a larger angle, thereby obtaining higher ion purity.

With respect to the method of ion implantation described in the embodiment, FIG. 2 shows that when the particle beam 4 passes through the first deflection magnetic field, the first deflection magnetic field can cause the target ions 5 in the particle beam 4 to be deflected downward by 20° from the original horizontal direction.

Based on the length of the first deflection magnetic field, and the deflection angle of 20°, the deflection distance of the target ions 5 in the vertical direction can be calculated. The first deflected particle beam can be thereby obtained by setting a baffle with appropriate height at the outlet of the first deflection magnetic field.

Since the uncharged impurity particles 6 in the beam line of the particle beam 4 are not affected by the first deflection magnetic field, the direction of its movement does not change. Therefore, the uncharged impurity particles 6 cannot pass through the outlet of the first deflection magnetic field, thereby being filtered by the first deflection magnetic field. The impurity particles 6 which are not charged in the beam line are greatly reduced.

To further increase the purity of the ions implanted into the semiconductor device, the first deflected particle beam can be further passed through the second deflection magnetic field. The second deflection magnetic field can cause a second deflection of the target ions 5 in the particle beam. A second deflected particle beam can be obtained by setting a baffle with appropriate height at the outlet of the second deflection magnetic field, thereby further filtering the unfiltered impurity particles in the first deflection, and further improving the purity of the ions implanted into the semiconductor device.

The first deflection and the second deflection may be in different directions, and the impurity ions 6 having a close charge-to-mass ratio to the target ions 5 are thereby better filtered.

The different directions may include different horizontal directions, and may also include different vertical directions in the same horizontal direction. The vertical directions can be represented by different deflection angles in the same horizontal direction.

As shown in FIG. 2, the second deflection may be a deflection upward by 20° from the original horizontal direction, so that the exit direction of the particle beam after the two deflections is consistent with the incident direction. The process and alignment of the apparatus for ion implantation is thereby facilitated.

In some embodiments, the embodiment of setting the first deflection downward by 20° and setting the second deflection upward by 20° to maintain the horizontal initial direction is an embodiment. In other embodiments, the first deflection and the second deflection may also be set by any deflection angle in any horizontal direction.

According to the method of ion implantation described in the embodiment, the ion implantation device 3 may be disposed at the outlet of the second angular energy filter device 22, corresponding to the exit direction of the particle beam. Thereby, the target ions 5 obtained by the two deflection filtrations of the first angular energy filter device 21 and the second angular energy filter device 22 can be implanted into the semiconductor wafer accurately.

According to the method of ion implantation described in the embodiment, the target ions 5 obtained from the outlet of the second deflection magnetic field may be accurately implanted into the semiconductor wafer with a corresponding angle.

As described above, in the conventional production process, multivalent ion implantation is used in order to achieve the set high energy requirements. In order to further filter the impurity ions 6 having a similar charge-to-mass ratio with the target ions 5 to avoid the low-valent energy pollution during the multivalent ion implantation process, an embodiment of the method of high-current ion implantation is also provided herein.

According to the method of ion implantation described in the embodiment, the target ions 5 and the impurity particles 6 in the particle beam 4 pass through the first deflection magnetic field and the second deflection magnetic field in an incident direction. The first deflection magnetic field may deflect the target ions 5 in the particle beam 4 downward by 20°. The second deflection magnetic field may deflect the target ions 5 in the particle beam 4 upward by 25°.

The first deflection magnetic field and the second deflection magnetic field may be provided by an electric field in the form of an acceleration voltage V. The target ions 5 and the charged impurity ions 6 in the particle beam 4 are accelerated by the acceleration voltage V to obtain the deflection energy E=qeV, wherein q is the number of charges of the target ions 5 and the charged impurity ions 6, and e is the charge of a unit charge.

Those skilled in the art may understand that the larger the acceleration voltage V, the greater the deflection energy obtained by the target ions 5 and the charged impurity ions 6 is. The deflection angle of the target ions 5 and the charged impurity ions 6 in the deflection magnetic field is thereby larger.

Therefore, the embodiment can achieve a further effect of filtering the impurity ions 6 which have a close charge-to-mass ratio to the target ions 5 by deflecting the particle beam 4 by different angles.

As shown in FIG. 3A, an embodiment of the method of high-current ion implantation is also provided herein.

According to the method of ion implantation described in the embodiment, the target ions 5 and the impurity particles 6 in the particle beam 4 pass through the first deflection magnetic field and the second deflection magnetic field in an incident direction. The first deflection magnetic field may deflect the target ions 5 in the particle beam 4 downward by a first angle. The second deflection magnetic field may deflect the target ions 5 in the particle beam 4 downward by a second angle.

The sum of the first angle and the second angle may be 20°, thereby achieving the effect of filtering the impurity particles 6 in the high-current ion implantation. The specific range of the sum of the angles depends on the specific implanted energy of the particle beam 4. The larger the implanted energy of the particle beam 4, the larger the sum of the angles is.

According to the method of ion implantation described in the embodiment, the first angle may be 8°. Based on the length of the first deflection magnetic field, and the first angle, the deflection distance of the particle beam 4 in the vertical direction can be calculated. The first deflected particle beam can be thereby obtained by setting a baffle with appropriate height at the outlet of the first deflection magnetic field. The outlet of the first deflection magnetic field may be smaller than the inlet of the first deflection magnetic field to remove the impurity particles 6 better.

Understandably, the small angle deflection method exemplified by the first angle can effectively filter out the uncharged impurity particles 6 and the charged impurity ions 6 which obtain high deflection energy from the first deflection magnetic field. However, in the actual production process of multivalent ion implantation, the method of small angle deflection, as well as the conventional single-stage deflection filtering method, cannot efficiently avoid the energy pollution of low-valent ions.

To further filter the impurity ions 6 with low deflection energy, the particle beam that has undergone the first deflection can be further passed through the second deflection magnetic field. The second deflection magnetic field can cause the second deflection of the target ions 5 in the particle beam. The second angle of the second deflection may be 1.5-2 times the first angle.

For example, the second deflection magnetic field may further deflect the deflected target ions 5 in the particle beam downward by 12° from its original horizontal direction in this embodiment, thereby satisfying the requirement that the target ions 5 need to be deflected by 20° in the high-current SEN (HCS) implanter.

The particle beam undergone the second deflection can be obtained by setting a baffle with appropriate height at the outlet of the second deflection magnetic field, thereby further filtering the impurity ions 6 having a charge-to-mass ratio close to the target ions 5, and further improving the purity of ions implanted into the semiconductor device.

The inlet of the second deflection magnetic field may be smaller than the outlet of the first deflection magnetic field, thereby blocking particulate contamination in the particle beam 4. The outlet of the second deflection magnetic field may also be smaller than the inlet of the second deflection magnetic field to further remove the impurity particles 6.

Understandably, the method of large angle deflection, exemplified by the second angle, can effectively filter out the charged impurity ions 6 that obtain low deflection energy from the second deflection magnetic field.

Those skilled in the art may understand that the sum of the first angle and the second angle is 20°, which is only a specific case to meet the demand of high-current SEN implanter (HCS). In other embodiments, the sum of the first angle and the second angle may be set within the range of 15°-20° responsive to the specific implanted energy of the particle beam 4, and the specific model and parameters of the ion implanter. Additionally, any angle within other suitable ranges may be also acceptable to obtain high purity target ions 5.

Setting the first deflection downward by 8° and setting the second deflection downward by 12° is only an embodiment being adaptive to the conventional high-current SEN (HCS) implanter with a downward deflection of 20°, thereby avoiding the need for adaptive modification of other configuration structures of the machine after adding the second deflection magnetic field. In other embodiments, the first deflection and the second deflection may also be set by any other deflection angle in any horizontal direction. The horizontal directions of the first deflection and the second deflection may also be different.

Those skilled in the art may also appreciate that the magnitude of the deflection magnetic field can be characterized by the magnetic flux B of the magnetic field.

The deflection radius R of the target ions 5 and the charged impurity ions 6 in the particle beam 4 in the deflection magnetic field conforms to the formula:

$$R = \frac{1}{B}\sqrt{\frac{mV}{q}} = \frac{X}{\sin\theta}.$$

In the formula, R is the deflection radius; B is the magnetic flux; V is the acceleration voltage of the electric field; X is the horizontal distance before and after the deflection of the particle beam 4; θ is the deflection angle.

It can be seen from the formula that the larger the deflection angle θ, the smaller the horizontal distance X before and after the deflection of the particle beam 4 is, so that the magnetic flux B is larger, which means that the power consumption of the apparatus for ion implantation is larger.

According to the method of ion implantation described in the embodiment, by dividing the total deflection angle of 20° into the first angle of 8° and the second angle of 12°, the power consumption of the method of ion implantation can be reduced as much as possible while maintaining the total deflection angle unchanged.

As shown in FIG. 3B, one embodiment of the present disclosure also provides an embodiment of the method of medium-current ion implantation.

According to the method of ion implantation described in the embodiment, the target ions 5 and the impurity particles 6 in the particle beam 4 pass through the first deflection magnetic field and the second deflection magnetic field in an incident direction. The first deflection magnetic field may deflect the target ions 5 in the particle beam 4 downward by a first angle. The second deflection magnetic field may deflect the target ions 5 in the particle beam 4 downward by a second angle.

The sum of the first angle and the second angle may be 15°, thereby achieving the effect of filtering the impurity particles 6 in the medium-current implantation. The specific range of the sum of the angles depends on the specific implanted energy of the particle beam 4. The larger the implanted energy of the particle beam 4, the larger the sum of the angles is.

According to the method of ion implantation described in the embodiment, the first angle may be 5°. Based on the length of the first deflection magnetic field, and the first angle, the deflection distance of the target ions 5 in the vertical direction can be calculated. The first deflected particle beam can be thereby obtained by setting a baffle with appropriate height at the outlet of the first deflection magnetic field. The outlet of the first deflection magnetic field may be smaller than the inlet of the first deflection magnetic field to remove the impurity particles 6 better.

To further filter the impurity ions 6 with low deflection energy, the particle beam that has undergone the first deflection can be further passed through the second deflection magnetic field. The second deflection magnetic field can cause a second deflection of the target ions 5 in the particle beam. The second angle of the second deflection may be 1.5-2 times the first angle. For example, in the present embodiment, the second deflection magnetic field further deflects the target ions 5 in the particle beam downward by 10° from the original horizontal direction, thereby satisfying the requirement that the target ions 5 need to be deflected by 15° in the medium-current SEN (MCS) implanter.

The second deflected particle beam can be obtained by setting a baffle with appropriate height at the outlet of the second deflection magnetic field, thereby further filtering the impurity ions 6 having a charge-to-mass ratio close to the target ions 5, and further improving the purity of ions implanted into the semiconductor device.

The inlet of the second deflection magnetic field may be smaller than the outlet of the first deflection magnetic field to block particulate contamination in the particle beam 4. The outlet of the second deflection magnetic field may also be smaller than the inlet of the second deflection magnetic field to further remove the impurity particles 6.

Understandably, the method of large angle deflection, exemplified by the second angle, can effectively filter out the charged impurity ions 6 that obtain low deflection energy from the second deflection magnetic field.

Those skilled in the art may appreciate that the sum of the first angle and the second angle is 15°, which is only a specific case to meet the demand of the medium-current SEN (MCS) implanter. In other embodiments, the sum of the first angle and the second angle may be set within the range of 15°-20° responsive to the specific implanted energy of the particle beam 4, and the specific model and parameters of the ion implanter Additionally, any angle within other suitable ranges may be also acceptable to obtain high purity target ions 5.

Setting the first deflection downward by 5° and setting the second deflection downward by 10° is only an embodiment being adaptive to the conventional medium-current SEN (MCS) implanter with a downward deflection of 15°, thereby avoiding the need for adaptive modification of other configuration structures of the machine after adding the second deflection magnetic field. In other embodiments, the first deflection and the second deflection may also be set by any other deflection angle in any horizontal direction. The horizontal directions of the first deflection and the second deflection may also be different.

What is claimed is:

1. A method of ion implantation, comprising:
   generating a particle beam that satisfies implanted energy, wherein the particle beam comprises target ions and impurity particles;
   applying a first deflection magnetic field to the particle beam to deflect the particle beam, and applying a second deflection magnetic field to the deflected particle beam to conduct a second deflection of the particle beam to separate the target ions from the impurity particles; and
   implanting the separated target ions into a semiconductor wafer.

2. The method of claim 1, wherein the first deflection magnetic field deflects the target ions by a first angle, and the second deflection magnetic field deflects the target ions by a second angle, wherein the first angle is different from the second angle.

3. The method of claim 2, wherein the second angle is greater than the first angle to enhance the separation of the target ions and the impurity particles in the second deflection.

4. The method of claim 3, wherein the first deflection magnetic field deflects the target ions by the first angle in a first direction, and the second deflection magnetic field deflects the target ions by the second angle in a second direction, which is different from the first direction.

5. The method of claim 3, wherein the first deflection magnetic field deflects the target ions by the first angle in a predetermined direction, and the second deflection magnetic field deflects the target ions by the second angle in the predetermined direction.

6. The method of claim 5, wherein the sum of the first angle and the second angle is proportional to the implanted energy.

7. The method of claim 6, wherein the sum of the first angle and the second angle is in the range of 15°-20°; and/or the second angle is 1.5-2 times the first angle.

8. An apparatus for ion implantation, comprising a particle generation device, a first angular energy filter device, a second angular energy filter device, and an ion implantation device; wherein
   the particle generating device generates a particle beam that satisfies implanted energy, wherein the particle beam comprises target ions and impurity particles;
   the first angular energy filter device applies a first deflection magnetic field to the particle beam to deflect the particle beam, and the second angular energy filter device applies a second deflection magnetic field to the deflected particle beam to conduct a second deflection of the particle beam to separate the target ions from the impurity particles; and
   the ion implantation device implants the separated target ions into a semiconductor wafer.

9. The apparatus of claim 8, wherein the first deflection magnetic field deflects the target ions by a first angle, and the second deflection magnetic field deflects the target ions by a second angle, wherein the first angle is different from the second angle.

10. The apparatus of claim 9, wherein the second angle is greater than the first angle to enhance the separation of the target ions and the impurity particles in the second deflection.

11. The apparatus of claim 10, wherein the first deflection magnetic field deflects the target ions by the first angle in a first direction, and the second deflection magnetic field deflects the target ions by the second angle in a second direction, which is different from the first direction.

12. The apparatus of claim 10, wherein the first deflection magnetic field deflects the target ions by the first angle in a predetermined direction, and the second deflection magnetic field deflects the target ions by the second angle in the predetermined direction.

13. The apparatus of claim 12, wherein the sum of the first angle and the second angle is proportional to the implanted energy.

14. The apparatus of claim 13, wherein the sum of the first angle and the second angle is in the range of 15°-20°; and/or
the second angle is 1.5-2 times the first angle.

15. The apparatus of claim 8, wherein an inlet of the first angular energy filter device is larger than an outlet of the first angular energy filter device to remove a portion of the impurity particles;
an inlet of the second angular energy filter device is larger than an outlet of the second angular energy filter device to remove a portion of the impurity particles; and
the inlet of the second angular energy filter device is smaller than the outlet of the first angular energy filter device.

* * * * *